United States Patent
Chang

[11] Patent Number: 5,581,098
[45] Date of Patent: Dec. 3, 1996

[54] CIRCUIT ROUTING STRUCTURE USING FEWER VARIABLE MASKS

[75] Inventor: Ted Chang, Mountain View, Calif.

[73] Assignee: Circuit Integration Technology, Inc., Sunnyvale, Calif.

[21] Appl. No.: 435,294

[22] Filed: May 5, 1995

[51] Int. Cl.⁶ .............................. H01L 23/50; H01L 27/00
[52] U.S. Cl. .......................... 257/211; 257/208; 257/776
[58] Field of Search ................................. 257/774, 202, 257/207, 208, 209, 210, 211, 776

[56] References Cited

U.S. PATENT DOCUMENTS

| | | | |
|---|---|---|---|
| 4,549,131 | 10/1985 | Kusazaki | 257/208 |
| 4,568,961 | 2/1986 | Noto | 257/210 |
| 4,750,026 | 6/1988 | Kuninobu et al. | 257/211 |
| 5,185,283 | 2/1993 | Fukui et al. | 257/208 |

FOREIGN PATENT DOCUMENTS

| | | | |
|---|---|---|---|
| 339534 | 11/1989 | European Pat. Off. | 257/209 |
| 54-32085 | 3/1979 | Japan | 257/208 |
| 3-270268 | 12/1991 | Japan | 257/208 |

*Primary Examiner*—Robert P. Limanek
*Assistant Examiner*—Alexander Oscar Williams
*Attorney, Agent, or Firm*—D'Alessandro & Ritchie

[57] ABSTRACT

A structure for routing connections in a semiconductor circuit constructed on a silicon wafer substrate, and a method for making that structure. The routing structure is constructed using two layers of electrical conductors and a set of interlayer connectors, but one of the electrical connection layers is predetermined and need not be programmable. The fixed electrical connection layer is laid out with a plurality of preselected routing connections, such as a set of horizontal or "east-west" connections laid out in a predetermined pattern. The variable electrical connection layer is programmed to make use of the preselected routing connections to connect disparate locations within the circuit on the semiconductor wafer, such as by making vertical or "north-south", and also horizontal, connections to selected horizontal connectors. The pattern of horizontal connections comprises a plurality of horizontal lines, with vertical spacing between pairs of neighboring lines. Each line comprises a set of one or more horizontal segments, with each segment extending for a selected length, and with selected amounts of horizontal spacing between pairs of neighboring segments. Selected lines, such as those coupled to ground or power, may continue without breaks. Preferably, the spacing between lines, the length of each segment, and the spacing between segments are all preselected before construction of the semiconductor circuit.

12 Claims, 1 Drawing Sheet

CIRCUIT ROUTING STRUCTURE USING FEWER VARIABLE MASKS

BACKGROUND OF THE INVENTION

1. Field of the Invention

This invention relates to a circuit routing structure using fewer variable masks, and a method of making that structure.

2. Description of Related Art

One design method used for custom circuitry on silicon chips is the "gate array," an array of digital logic gates whose connections are programmed to form a circuit satisfying the designer's requirements. Gate arrays are generally programmed by varying one or more masks in the masked lithography process that is commonly used to manufacture semiconductor circuits, so as to provide connectors for routing between circuits in the gate array. In a typical process for constructing semiconductor circuits, masks which may be varied include a contact layer, a metal-1 layer, a via layer, and a metal-2 layer.

One problem that has arisen in the art is that each mask which must be varied has a substantial cost, due to the expense of designing and making the mask. Additional masks also increase the length of the fabrication cycle, and reduce the yield of good semiconductor circuits which are produced. It would be advantageous to provide a system in which elements for routing between circuits in a gate array could be constructed while using a reduced number of programmable layers.

SUMMARY OF THE INVENTION

The invention provides a structure for routing connections in a semiconductor circuit constructed on a silicon wafer substrate, and a method for making that structure. The routing structure is constructed using two layers of electrical conductors and a set of inter-layer connectors, but one of the electrical connection layers is predetermined and need not be programmable.

In a preferred embodiment, the fixed electrical connection layer is laid out with a plurality of preselected routing connections, such as a set of horizontal or "east-west" connections laid out in a predetermined pattern. The variable electrical connection layer is programmed to make use of the preselected routing connections to connect disparate locations within the circuit on the semiconductor wafer, such as by making vertical or "north-south", and also horizontal, connections to selected horizontal connectors.

In a preferred embodiment, the pattern of horizontal connections comprises a plurality of horizontal lines, with vertical spacing between pairs of neighboring lines. Each line comprises a set of one or more horizontal segments, with each segment extending for a selected length, and with selected amounts of horizontal spacing between pairs of neighboring segments. Selected lines, such as those coupled to ground or power, may continue without breaks. Preferably, the spacing between lines, the length of each segment, and the spacing between segments are all preselected before construction of the semiconductor circuit.

DESCRIPTION OF THE PREFERRED EMBODIMENT

Figure 1:
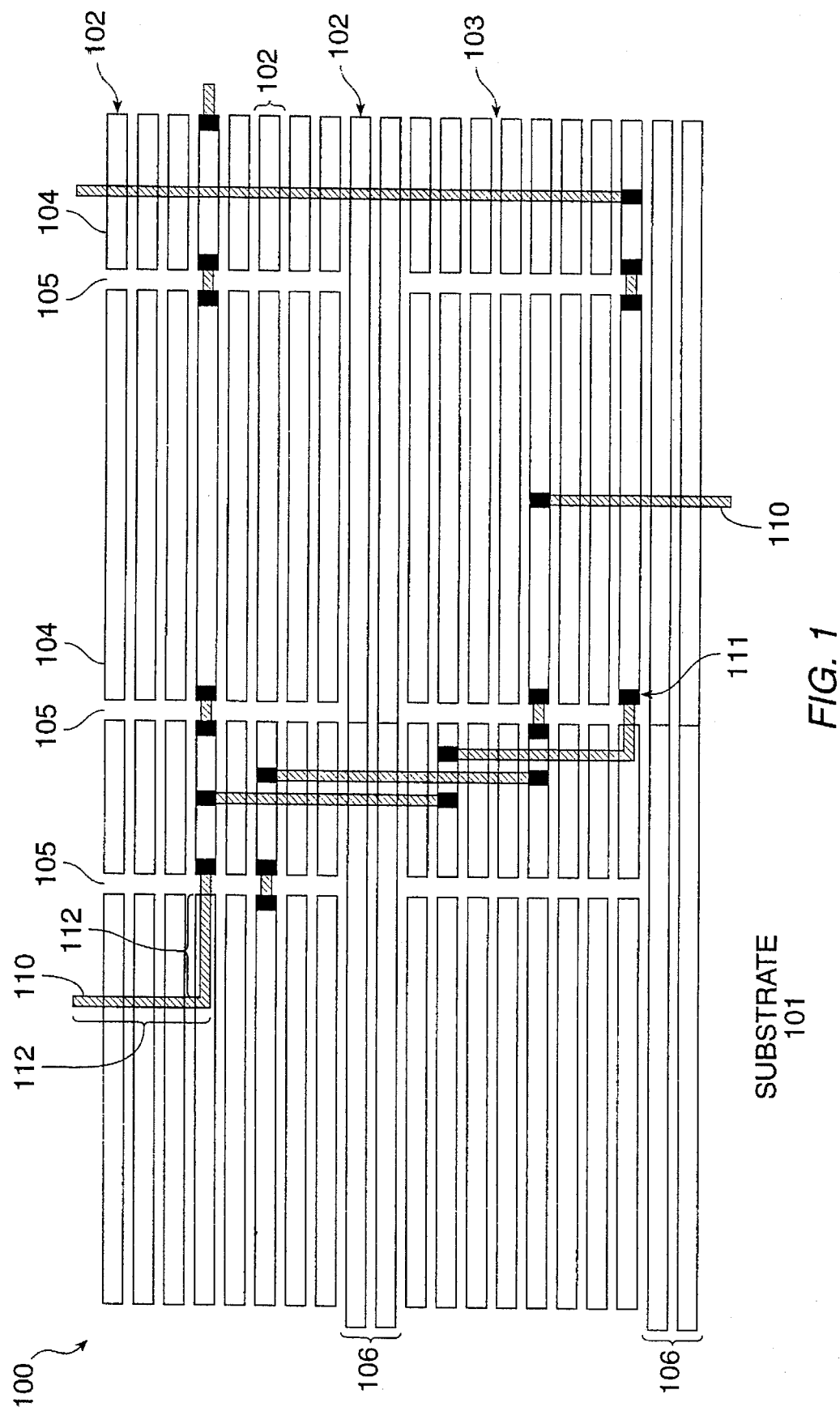
FIGURE 1 shows a diagram of an arrangement for routing between elements in a programmable gate array.

FIG. 1 shows a diagram of an arrangement for routing between elements in a programmable gate array.

An apparatus 100 for routing between elements in a programmable gate array comprises a substantially planar substrate 101, such as a silicon wafer, and a set of multiple layers of circuits disposed thereon. In a preferred embodiment, these layers include a metal-1 layer (i.e., a first layer of conductive metal), a metal-2 layer (i.e., a second layer of conductive metal), and a via layer. These layers are known in the art, and are further described, for example, in Carver Mead and Lynn Conway, "Introduction to VLSI Systems", (Addison-Wesley 1980).

Although a preferred embodiment uses metal-1, metal-2, and via layers, those skilled in the art would recognize after perusal of this application that the invention is also applicable to other layers used in semiconductor circuits, such as a third or further metal layer, one or more polysilicon layers, and other and further layers.

Horizontal Lines

Disposed on the substrate 101 as part of a metal layer "A" is a set of substantially horizontal (or "east-west") lines 102, each of which comprises an electrical connector for routing between circuits. In a preferred embodiment, these horizontal lines 102 are constructed using the metal-2 layer, using a 1.2 micron fabrication technology. Each horizontal line 102 is preferably wide enough to couple to and accommodate a via anywhere on the horizontal line 102, i.e., approximately 3.0 microns wide. Horizontal lines 102 are vertically interleaved with and separated by spaces 103 which are approximately 1.8 microns wide.

However, those skilled in the art would recognize after perusal of this application that there is no specific requirement for this particular fabrication technology, this particular metal layer, these particular dimensions (or any other particular dimensions described herein), or this particular orientation (horizontal) for the metal layer "A". In alternative embodiments, other fabrication technologies, other metal layers or other layers, other dimensions, or other orientations (e.g., vertical) could be used.

The horizontal lines 102 generally each comprise a plurality of segments 104, interleaved with a plurality of spaces 105 which are approximately 2.4 microns long. The segments 104 alternate between relatively longer segments 104 which are approximately 67.2 microns long and relatively shorter segments 104 which are approximately 24 microns long.

Selected pairs 106 of horizontal lines 102 continue without breaks and are preferably coupled to ground or power. In a preferred embodiment, these selected pairs 106 are interleaved in a vertical direction with those horizontal lines 102 which are segmented, and recur after every eight segmented horizontal lines 102.

Vertical Lines

Disposed on the substrate 101 as part of a metal layer "B" is a set of substantially vertical (or "north-south") lines 110, each of which comprises an electrical connector for routing between circuits. In a preferred embodiment, these vertical lines 110 are constructed using the metal-1 layer. Each vertical line 110 is the minimum line width, i.e., approximately 1.4 microns.

However, as with the horizontal lines 102, those skilled in the art would recognize after perusal of this application that there is no specific requirement for this particular metal layer, these particular dimensions, or this particular orientation (vertical) for the metal layer "B". In alternative embodiments, other metal layers or other layers, other dimensions, or other orientations (e.g., horizontal) could be used.

The vertical lines 110 cross the horizontal lines 102 and are coupled to the horizontal lines 102 at selected locations by one or more vias 111. Each via 111 couples the metal layer "A" (preferably metal-2) to the metal layer "B" (preferably metal-1). The concept of vias is known in the art, and is further described, for example, in Carver Mead and Lynn Conway, "Introduction to VLSI Systems", (Addison-Wesley 1980).

Although the vertical lines 110 are generally orthogonal to the horizontal lines 102, the vertical lines 110 may comprise both generally vertical segments 112 and generally horizontal segments 113, so as to couple to the horizontal lines 102 at selected locations. For example, a vertical line 110 may comprise only a horizontal segment 113, e.g., to couple two segments 104 of a horizontal line 102 across a space 105.

Because the metal layer "A" is predetermined, one mask operation is saved. In a preferred embodiment, the shape of the vias 111 is also predetermined to match the shape of the horizontal lines 102 and the vertical lines 110. Moreover, a predetermined architecture for the metal layer "A" speeds up the design process, decreasing the time needed to create the gate array. The apparatus also provides fewer opportunities for error, thus increasing the average yield for semiconductor circuits produced using this apparatus 100 for routing.

Alternative Embodiments

Although preferred embodiments are disclosed herein, many variations are possible which remain within the concept, scope, and spirit of the invention, and these variations would become clear to those skilled in the art after perusal of this application.

I claim:

1. Apparatus for routing connections in a semiconductor circuit, said apparatus comprising a substantially planar substrate over which a monolithic semiconductor circuit is disposed;

a metal layer "A" disposed over said substrate, said layer "A" consisting essentially of a preselected plurality of connectors each substantially oriented in a first direction, adjacent pairs of said connectors being separated by a first preselected distance in a second direction substantially orthogonal to said first direction, said connectors each comprising a set of segment each having a preselected length, adjacent pairs of said segments being separated by a second preselected distance in said first direction;

a metal layer "B" disposed over said substrate, said layer "B" being mask programmable and comprising a plurality of connectors disposed to couple from a first circuit location to a second circuit location by means of said layer "A"; and a set of vias disposed to couple said layer "B" to said first and second circuit locations by means of said layer "A";

wherein said apparatus provides a useful circuit without further modification.

2. Apparatus as in claim 1, wherein said adjacent pairs of said connectors in said layer "A" are separated by a first preselected distance in a first region of said layer "A" and by a second preselected distance in a second region of said layer "A".

3. Apparatus as in claim 1, wherein said first direction is a relatively horizontal direction and said second direction is a relatively vertical direction.

4. Apparatus as in claim 1, wherein said first direction is a relatively vertical direction and said second direction is a relatively horizontal direction.

5. Apparatus as in claim 1, wherein said layer "A" is above said layer "B".

6. Apparatus as in claim 1, wherein said layer "A" is below said layer "B".

7. Apparatus as in claim 1, wherein said segments of said connectors in said layer "A" are separated by a first preselected distance in a first region of said layer "A" and by a second preselected distance in a second region of said layer "A".

8. Apparatus as in claim 1, wherein said segments of said connectors in said layer "A" have a first preselected length in a first region of said layer "A" and have a second preselected length in a second region of said layer "A".

9. Apparatus for routing connections in a semiconductor circuit, said apparatus comprising a substantially planar substrate over which a monolithic semiconductor circuit is disposed;

a metal layer "A" disposed over said substrate, said layer "A" consisting essentially of a preselected plurality of connectors each substantially oriented in a first direction;

a metal layer "B" disposed over said substrate, said layer "B" being mask programmable and comprising a plurality of connectors disposed to couple from a first circuit location to a second circuit location by means of said layer "A", said plurality of connectors for said layer "B" being largely free of segments oriented in said first direction; and a set of vias disposed to couple said layer "B" to said first and second circuit locations by means of said layer "A";

wherein said apparatus provides a useful circuit without further modification.

10. Apparatus for routing connections in a semiconductor circuit, said apparatus comprising a substantially planar substrate over which a monolithic semiconductor circuit is disposed;

a metal layer "A" disposed over said substrate, said layer "A" consisting essentially of a preselected plurality of connectors each substantially oriented in a first direction; said connectors each comprising a set of segments each having a preselected length, adjacent pairs of said segments being separated by a second preselected distance in said first direction;

a metal layer "B" disposed over said substrate, said layer "B" being mask programmable and comprising a plurality of connectors disposed to couple from a first circuit location to a second circuit location by means of said layer "A", said plurality of connectors for said layer "B" being substantially oriented in a second direction at a substantial angle from said first direction; and a set of vias disposed to couple said layer "B" to said first and second circuit locations by means of said layer "A";

wherein said apparatus provides a useful circuit without further modification.

11. Apparatus as in claim 1, wherein said set of vias is mask programmable.

12. Apparatus as in claim 1, wherein said plurality of connectors for said layer "B" are substantially oriented in said second direction.

\* \* \* \* \*

UNITED STATES PATENT AND TRADEMARK OFFICE
CERTIFICATE OF CORRECTION

PATENT NO. : 5,581,098
DATED : December 3, 1996
INVENTOR(S) : Ted Chang

It is certified that error appears in the above-indentified patent and that said Letters Patent is hereby corrected as shown below:

---Column 3, line 40, replace "segment" with --segments--.

Signed and Sealed this

Eleventh Day of March, 1997

*Attest:*

BRUCE LEHMAN

*Attesting Officer*      *Commissioner of Patents and Trademarks*